United States Patent
Kandolf et al.

(10) Patent No.: US 7,362,650 B2
(45) Date of Patent: Apr. 22, 2008

(54) MEMORY ARRANGEMENT HAVING A PLURALITY OF RAM CHIPS

(75) Inventors: Helmut Kandolf, Graz (AT); Sven Kalms, Taufkirchen (DE); Maksim Kuzmenka, Munich (DE); Michael Hausmann, Graz (AT)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 11/394,142

(22) Filed: Mar. 30, 2006

(65) Prior Publication Data

US 2006/0250881 A1   Nov. 9, 2006

Related U.S. Application Data

(63) Continuation of application No. PCT/EP2004/010430, filed on Sep. 17, 2004.

(30) Foreign Application Priority Data

Sep. 30, 2003   (DE) ................................ 103 45 550

(51) Int. Cl.
   *G11C 8/00*   (2006.01)
(52) U.S. Cl. ........................... 365/230.04; 365/189.04; 365/189.01
(58) Field of Classification Search ........... 365/230.05, 365/230.04, 189.01, 189.04
   See application file for complete search history.

(56) References Cited

U.S. PATENT DOCUMENTS

| | | | |
|---|---|---|---|
| 6,072,744 A | 6/2000 | Kwean | |
| 6,148,363 A * | 11/2000 | Lofgren et al. | 365/185.33 |
| 6,330,636 B1 | 12/2001 | Bondurant et al. | |
| 6,353,539 B1 | 3/2002 | Horine et al. | |
| 6,396,766 B1 | 5/2002 | Lee | |
| 6,775,169 B1 * | 8/2004 | d'Acoz et al. | 365/52 |
| 6,882,082 B2 * | 4/2005 | Greeff et al. | 365/223 |
| 7,200,024 B2 * | 4/2007 | Taylor | 365/64 |
| 2001/0038566 A1 | 11/2001 | Schrogmeier et al. | |
| 2003/0099149 A1 | 5/2003 | Braun et al. | |
| 2004/0196682 A1 * | 10/2004 | Funaba et al. | 365/149 |

FOREIGN PATENT DOCUMENTS

WO    9919876 A1    4/1999

* cited by examiner

*Primary Examiner*—Thong Q. Le
(74) *Attorney, Agent, or Firm*—Patterson & Sheridan, L.L.P.

(57) ABSTRACT

Embodiments of the invention provide a memory arrangement having an even number k=4 of physically spaced RAM chips, on each of which it is possible for m data items to be simultaneously written or read via an m-bit data bus, also having a register for buffer-storing and transmitting n respective parallel data bits as a packet between an n-bit parallel port and the data buses, and having a selection device which responds to selection bits in order to select a respective separate cell group within the plurality of the chips for each of the disjoint m-bit groups (d) of the n-bit packet. The k chips are classified into q=2 disjoint chip groups, each of which comprises k/q chips which differ as little as possible from one another in terms of their distance from the register. The number m is chosen to be equal to q*n/k, and the selection device is designed to select a respective separate chip from the same chip group and a cell group in this chip for each m-bit group of the same n-bit packet.

18 Claims, 5 Drawing Sheets

Arrival of read data at DR in Figure 2

Burst length r = 8

Arrival of read data at DR in Figure 4

Burst length r = 4

MEMORY ARRANGEMENT HAVING A PLURALITY OF RAM CHIPS

CROSS-REFERENCE TO RELATED APPLICATIONS

This application is a continuation of co-pending PCT patent application No. PCT/EP 2004/010430, filed Sep. 17, 2004, which claims the benefit of German patent application serial number DE 103 45 550.7, filed 30 Sep. 2003. Each of the aforementioned related patent applications is herein incorporated by reference in its entirety.

BACKGROUND OF THE INVENTION

1. Field of the Invention

The invention relates to a memory arrangement which contains a plurality of Random Access Memory (RAM) chips having a respective multiplicity z of memory cells.

2. Description of the Related Art

The memory cells in a RAM chip, which is subsequently also referred to as a "RAM" for short, are usually arranged in matrix form in rows and columns. Selective access to a memory cell for the purpose of writing or reading a data item is effected by activating a word line associated with the relevant row on the basis of a row address and connecting a bit line associated with the relevant column to a bidirectional data port on the RAM. This connection is set up using a data line network containing amplifiers and switches which can be selectively activated on the basis of a column address.

RAMs are normally in a form such that each access clock cycle involves not just a single memory cell but rather a group of m memory cells being able to be selected simultaneously, in order to write or read m data bits simultaneously in parallel form. To this end, the addresses and the data line network are designed such that in response to a column address m bit lines are simultaneously connected to m data connections on the data port of the RAM via the data line network. With this memory organization, each column address therefore selects an entire cell group in the row determined by the row address.

The number m, that is to say the power of the disjoint cell groups and hence the bit width of the data passing through the data port, is preferably a power of 2; m-values of 4, 8 and 16 are currently usual. Many RAMs, particularly DRAMs, are configured during manufacture such that the m-value can be selected or set in order to operate the RAM optionally in 4-bit, 8-bit or 16-bit mode.

To produce RAM data storage with a large storage capacity and/or with a high data throughput, it is usual practice to combine a plurality k of RAM chips, which are respectively integrated on a chip and are designed or set for the same bit width m, to produce one module on a board. In the prior art, all k chips are simultaneously accessed in parallel mode in order to write or read a packet of k data groups, each of which comprises m parallel data items, during each access operation. To this end, the module has a central data port for n=m*k parallel bits and a central n-bit parallel register (the symbol * represents a multiplication sign here and below). The data ports on the k chips are connected to the central register (which serves as a data buffer between the central n-bit module port and the RAM chips) in parallel via a respective associated m-bit data bus.

Figure 1:
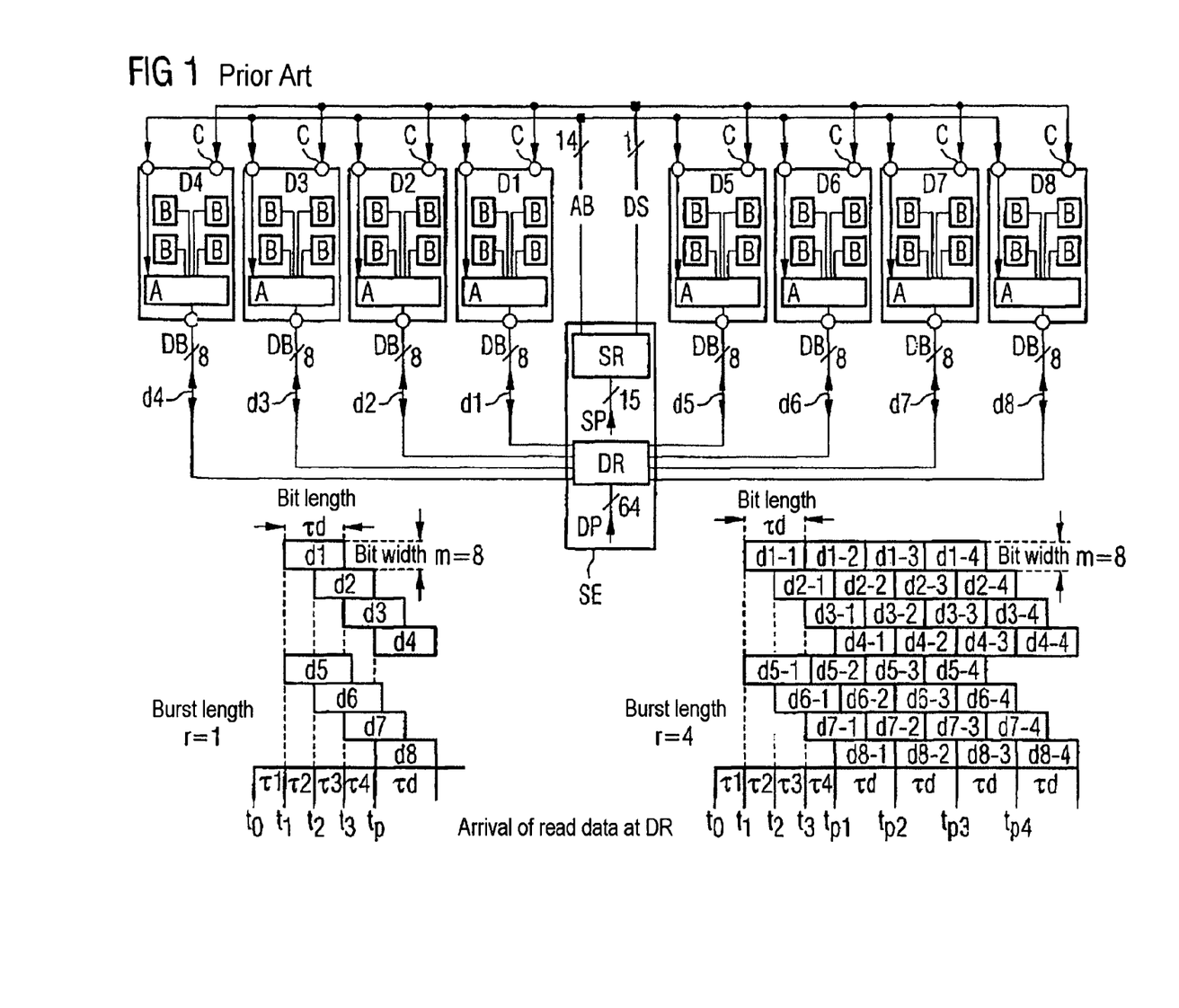
FIG. 1 illustrates a conventional memory module having n=64 data connections and associated diagrams for the data transfer in this module for a burst length r=1 and a burst length r=4 as known in the prior art.

An example of the design of a known memory module having n=64 data connections is shown in the top part of FIG. 1 in the appended drawings. The bottom part of this figure shows the diagrams for the data transfer in this module for a burst length r=1 and a burst length r=4. In FIG. 1, as in the other figures of the drawing, elements of the same type have been denoted by the same abbreviations (letters or combinations of letters), usually followed by a serial number in order to distinguish them. Where the text of the description contains a collection comprising a plurality of elements of the same type in a set, the numbers which follow have been placed in square brackets [], with a colon ":" between two numbers representing the word "to" and a comma "," representing the word "and". By way of example, "data groups d[1,5]-1" is to be read as "data groups d1-1 and d5-1".

The known memory module from FIG. 1 contains a "rank" comprising k=8 RAM chips D[1:8], which are respectively set to a bit width of m=8, in order to write or read data packets with a bit width n=k*m=64 via the central module data port DP. The data are transmitted between the data port DP and the RAMs D[1:8] via a central buffering data register DR. The RAMs D[1:8] are respectively connected to the data register DR in parallel via a respective associated instance of eight 8-bit data buses DB. The data interface of each RAM, that is to say the junction to the respective associated data bus, usually contains a local data buffer in the form of an m-bit parallel register (not shown).

Usually, the data packets which have been input or output at the data port DP are sent or received by a controller (not shown), which also delivers control signals to the input port SP of a control signal register SR. These control signals comprise all the necessary signals for command and time-control for the operating cycles within the RAMs and also control bits ("selection bits") for addressing eight cell groups in the rank, specifically a respective one in each of the eight RAMs D[1:8] in the rank, for each 64-bit data packet. For the example shown in FIG. 1, it is assumed that the RAMs D[1:8] each contain $z=2^{27}$ memory cells, split over $4=2^2$ memory banks B. To select a cell group of $m=8=2^3$ cells within a RAM, 24 address bits are therefore required. The selection bits delivered by the controller comprise a total of 25 bits, namely an additional bit in order to put the rank in standby.

This total of 25 selection bits is allocated by the control signal register SR as follows:

1 Rank selection bit,
  which is applied to the "Chip Select" connections C of all the RAMs D[1:8] via a line DS in order to blanket-select the RAMs (that is to say to put the entire rank on standby) by means of the logic value "1" of this bit, whereas the logic value "0" of this bit means that the rank is "not selected";

2 Bank address bits
  for selecting between $2^2$ banks within the RAM;

12 Row address bits
  for selecting between $2^{12}$ row addresses within the bank;

10 Column address bits
  for selecting between $2^{10}$ disjoint column groups of m=8 columns each and hence m=8 cell groups for each row address.

The 24 address bits for addressing banks, rows and columns within the RAMs are applied to the RAMs D[1:8] via an address bus AB. The address bus AB usually contains just 14 address lines, namely 2 lines for the bank address bits and 12 further lines, via which the 12 row address bits are transmitted first. The 10 column address bits are then subsequently transmitted via 10 assigned instances of these 12 lines.

The transmitted 25 selection bits arrive at the usual access control device A in each RAM, which sets up the read or write connection between the selected cell group and the data bus DB of the relevant RAM in a known manner. The lines for transmitting the other control signals from the control signal register SR to the RAMs are not shown in the figure, so as not to make the drawing too complicated. The central control signal register SR and the access control devices A in the RAMs thus together form the "selection device" for the memory cell access.

Since the individual RAM chips D[1:8] are arranged at a physical distance from one another, the data buses DB between the data register DR and the various chips are not all of the same length, which means that delay time differences arise on account of the differences in distance. The same applies to the control lines between the chips and the control signal register SR. The result of this is that after the start of a read access operation the 8-bit data groups from the various chips do not arrive all data at the data register DR simultaneously but rather at staggered times, which has disadvantageous consequences. The pattern of this time stagger is dependent on the specific physical arrangement of the parts of the module.

The module shown in FIG. 1 is a "dual inline memory module" (DIMM) with a rank in which the two halves, with four RAM chips each, are arranged symmetrically with respect to the transmission/reception block SE, which contains the registers DR and SR for the data and control signals. This means that two RAM chips are always at the same distance away from the transmission/reception block SE. Following the start command for access, a certain control signal delay time elapses before the control signals and selection bits transmitted by the control signal register SR have arrived at the two physically closest chips D[1,5] in order to initiate the actual read operation. A certain RAM response time then elapses before the data from the selected memory cells are available on the data connections of the chip and can be retrieved. Following retrieval, another data delay time elapses before the data have reached the data register DR via the associated data bus DB. The sum of these three time periods, that is to say the total loop delay for the "round trip" through the loop, which is routed from the transmission/reception block SE via the closest RAM chips D[1:5] back to the transmission/reception block SE, is subsequently labelled $\tau 1$:

$\tau 1$=loop delay via D[1,5].

The greater the distance between the RAM chips and the transmission/reception block SE, the longer it takes before the read data arrive at the data register DR in the transmission/reception block SE following the start command, because the control-signal and data delay times become longer as the distance increases (only the RAM response time does not change). For the chip pairs D[2:6], D[3,7] and D[4,8], increasingly longer loop delays are therefore obtained on the basis of the following definition:

$\tau 1+\tau 2$=loop delays via D[2,6]

$\tau 1+\tau 2+\tau 3$=loop delays via D[3,7], $\tau 1+\tau 2+\tau 3+, \tau 4$=loop delays via D[4,8].

The bottom part of FIG. 1 shows timing diagrams for the time-staggered arrival of the data at the register DR. Each read data group transmitted from a RAM chip via the associated data bus DB to the register DR and comprising m parallel bits is shown by a box, the length of which indicates the "bit length" $\tau d$ of the data. The bit length $\tau d$ is the length of time from the start of the leading edge to the end of the trailing edge of a data pulse.

The left-hand timing diagram in FIG. 1 illustrates the case in which a single n-bit packet (burst length r=1) is read. At time t0, the start command for the read access operation is given on the control signal register SR. The data register DR first of all, after the loop delay $\tau 1$ at time t1, receives the 8-bit data groups d1 and d5 from the two closest chips D1 and D5; after a further delay $\tau 2$, the data groups d2 and d6 arrive from the chips D2 and D6 at time t2, followed after a further delay $\tau 3$ by the data groups d3 and d7 from the chips D3 and D7 at time D3, and finally after a further delay $\tau 4$ by the last data groups d4 and d8 in the packet from the two most distant chips D4 and D8 at time tp. Only then, but no later than at time tp+$\tau d$, have all the data received last been validly loaded into the register DR, and all the data groups d[1:8] can be forwarded to the data port DP in parallel as a 64-bit packet. An additional waiting time $Tx=\tau 2+\tau 3+\tau 4$ between the arrival of the first data group and the arrival of the last data group therefore arises for a read access operation.

The aforementioned additional waiting time Tx does not change at all when a burst comprising a plurality of successive 64-bit packets is read on the memory module within a read cycle after the start command, as illustrated in the right-hand timing diagram in FIG. 1 for the case of a burst length of r=4. The first n-bit packet, comprising the first m-bit data groups d[1:8]-1 (that is to say data groups d1-1, d2-1, . . . , d8-1), has arrived at the data register DR fully only after the loop delay $\tau 1$ plus the additional waiting time Tx=$\tau 2+\tau 3+\tau 4$ at time tp1.

When the burst clock rate has been set to the fastest possible value 1/$\tau d$, as shown in FIG. 1, the next three packets d[1:8]-2, d[1:8]-3, d[1:8]-4 in the burst arrive at the respective destination at time intervals of $\tau d$. The total time Tb from the arrival of the first data to the end of the burst at the reception location is thus at least equal to $Tb=Tx+4*\tau d$, or, generally for any number k of RAM chips in the memory module and for any burst length r:

$Tb=Tx+r*\tau d$, where Tx is the delay time difference between the data buses on the closest of all k chips and the data buses on the furthest of all k chips.

After a read cycle has started, it is thus always necessary to wait for the time period Tb in total before the next read cycle or a subsequent write cycle can be started. The additional waiting time Tx thus limits the speed at which individual read cycles on the memory module can follow one another or at which a write cycle can follow a read cycle.

U.S. Pat. No. 6,396,766 B1 discloses a memory arrangement in which the central register is split into two sub-registers, each of the two sub-registers being connected to a portion of the RAM chips, with the sub-registers being arranged relative to the connected RAM chips such that essentially the same data bus lengths are ensured between the RAM chips and the respective sub-register, in order to reduce read and write delays on account of different data bus lengths.

U.S. Pat. No. 6,330,636 B1 also discloses a memory arrangement operating in burst mode.

SUMMARY OF THE INVENTION

One embodiment of the invention is a memory arrangement having a plurality of physically spaced RAM chips with little hardware complexity such that delays during reading and writing on account of different data bus lengths are reduced. The acronym RAM is known to refer to a read/write memory with direct and random access to the memory cells. A preferred but not exclusive area of application for embodiments of the invention is memory arrangements containing dynamic RAMs (known as "DRAMs"), as are customary as main memories in computers.

One embodiment of the invention is a memory arrangement which contains the following: an even number $k \geq 4$ of physically spaced RAM chips, each of which has a multiplicity z of memory cells which are organized in disjoint cell groups comprising m respective memory cells which can respectively be selected simultaneously by a cell group address in order for m data items to be respectively written or read via an m-bit data bus on the chip; a register for buffer-storing and transmitting n respective parallel data bits as a packet between an n-bit parallel port and the data buses, where n is an integer multiple of m; a selection device which responds to selection bits in order to select a respective separate cell group within the plurality of the chips for each of the disjoint m-bit groups of the n-bit packet. The invention consists in the fact that the k chips are classified into $q \geq 2$ disjoint chip groups, each of which comprises k/q chips which differ as little as possible from one another in terms of their distance from the register, and that m=q*n/k, and that the selection device is designed to select a respective separate chip from the same chip group and a cell group in this chip for each m-bit group of the same n-bit packet.

By virtue of the inventive classification of the RAM chips into groups, the inventive proportioning of the bit width m on each chip and the inventive design for the selection of the m-bit data groups combined into a respective packet, the additional waiting time Tx defined above after each read cycle is shortened, for each access operation, to the measure of the propagation time difference between the shortest and the longest data bus within the respective chip group. Read cycles can follow one another and alternate with write cycles correspondingly more quickly.

Further embodiments of the invention provide advantageous refinements and developments, particularly as regards the measures for a burst mode (burst lengths r>1).

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

DETAILED DESCRIPTION OF THE PREFERRED EMBODIMENT

Figure 2:
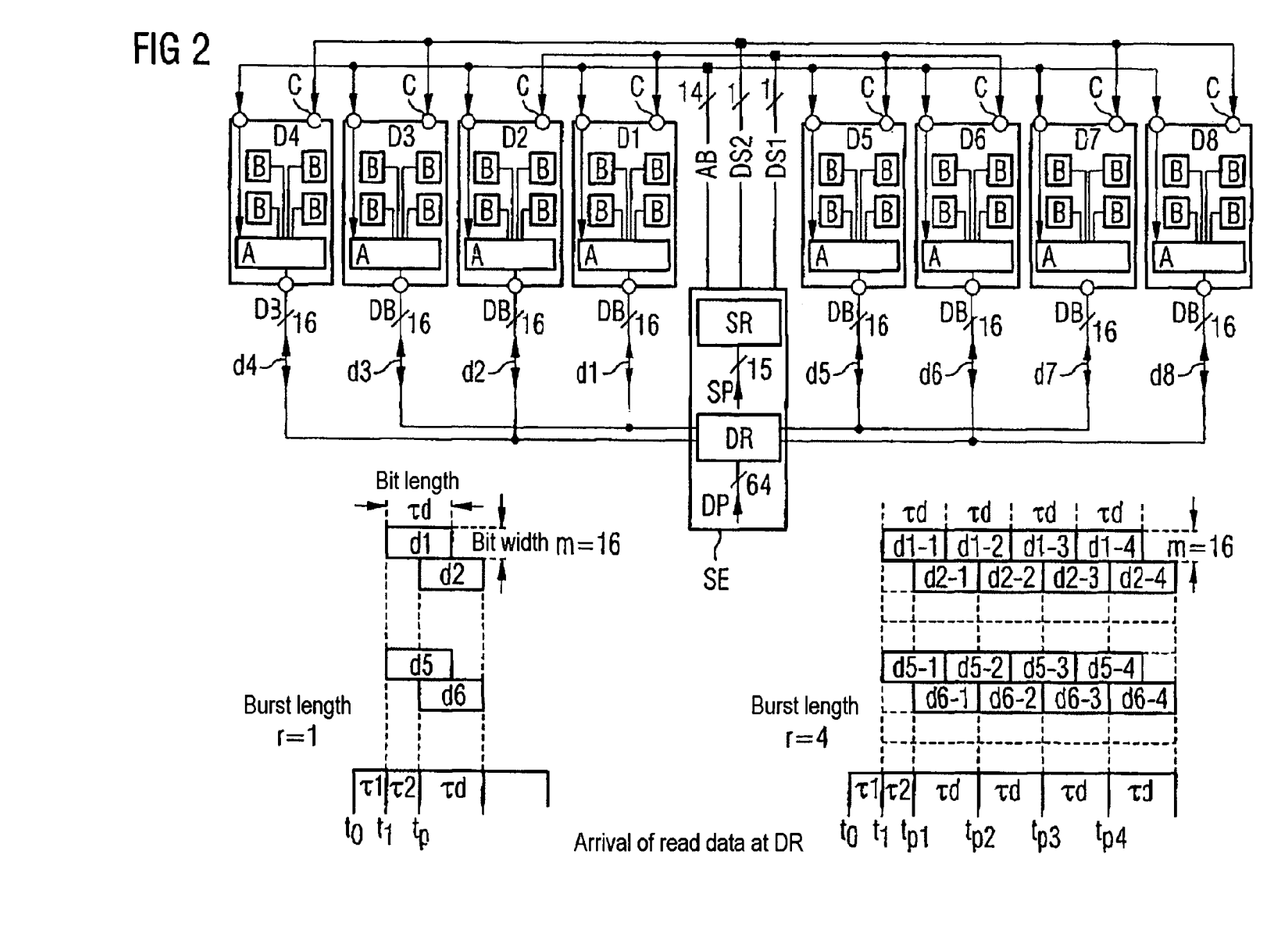
FIG. 2 uses a similar manner of illustration to FIG. 1, which has already been dealt with, to show an inventive form of a memory module having k=8 RAM chips and also illustrates diagrams of the time-staggered arrival of read data at the data register with burst lengths r=1 and r=4.
Figure 4:
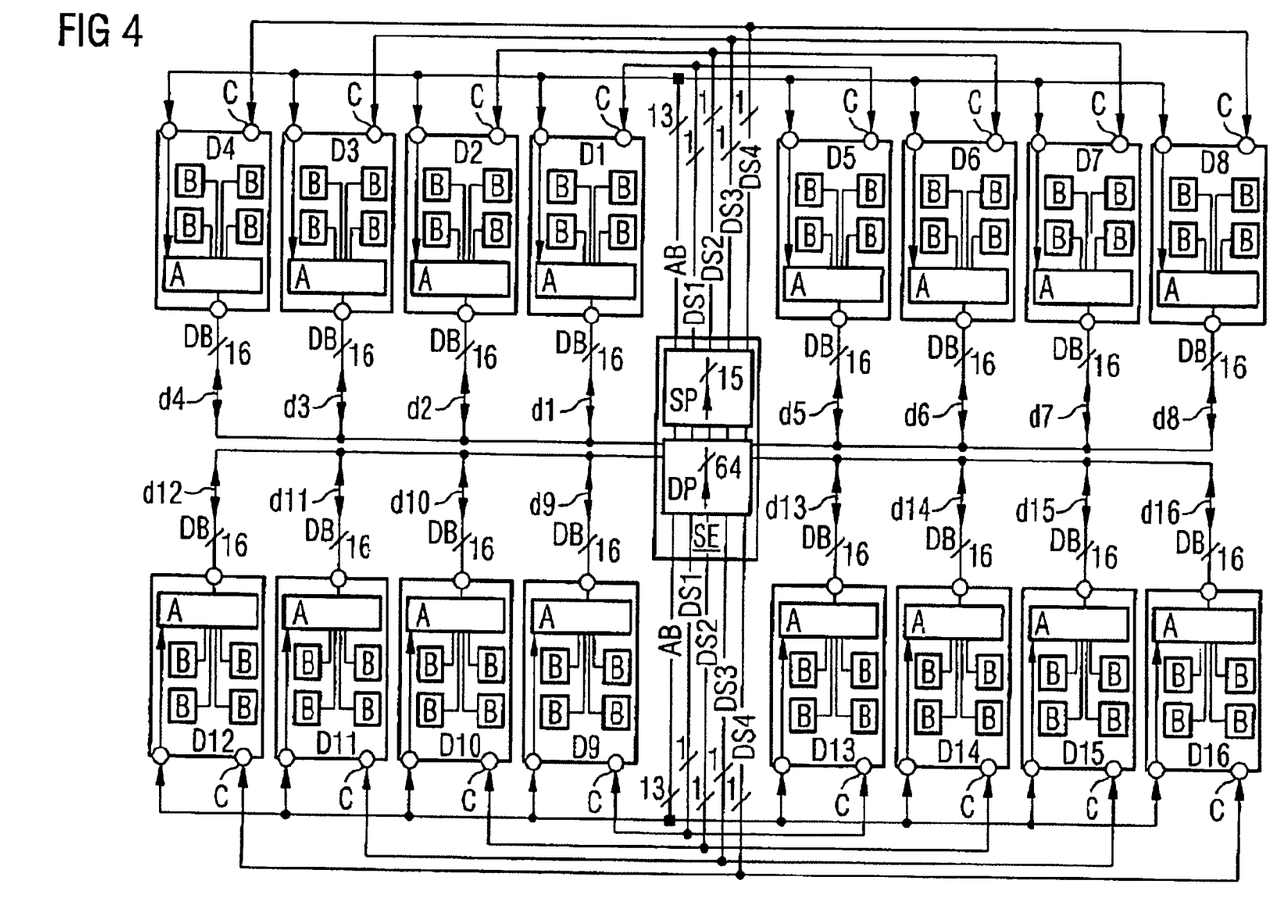
FIG. 4 shows an inventive form of a memory module having k=16 RAM chips.

Many elements which are shown in FIGS. 2 and 4 equate or correspond to individual elements in FIG. 1, which has already been described above, in terms of design and function. The same elements are denoted by the same abbreviations, and reference can be made to the description relating to FIG. 1 for a detailed description of them.

The memory module shown in FIG. 2 contains eight RAM chips D[1:8], which each have the same storage capacity (number of cells $z=2^{27}$) and have a similar design to the chips shown in FIG. 1. The chips D[1:8] are arranged on both sides of the central transmission/reception block SE, which contains the central data register DR and the central control signal register SR, in the same manner as in the case in FIG. 1. Each of the chips D[1:8] is connected to the data register DR via a respective data bus DB, and the address bit inputs of all the chips are connected to an address bus AB which is connected to the control signal register SR, which also delivers the signals for the Chip Select inputs C on the chips D[1:8].

The memory module shown in FIG. 2 is in a form such that for each n-bit data packet the total set of all the k RAM chips is not accessed, but rather just one respective chip group which forms a subset within which the distances to the transmission/reception block SE differ as little as possible. Consequently, the delay difference between the same respective packet's data items arriving at the data register DR during reading is less than in the known conventional memory modules.

In the example shown in FIG. 2, the RAM chips D[1:8] are classified into q=2 groups of equal size: the first group comprises the four "close" chips D[1,2,5,6] and the second group comprises the four "distant" chips D[3,4,7,8]. So that within each chip group it is possible to access n=64 data items simultaneously, each chip is organized for a bit width of m=q*n/k=2*64/8=16, and the data buses DB are proportioned to be of corresponding width. The 16-bit data buses DB from two respective RAM chips belonging to different chip groups are interconnected and connected to the same connections of the central register. Specifically, the two data buses of the chip pair D[1,3] are interconnected, as are the data buses of the pair D[2,4], of the pair D[5,7] and of the pair D[6,8].

To select the respective chip group within the rank for a data packet, one of the selection bits delivered by the controller needs to be reserved specifically for this purpose. Since $m=16=2^4$, on the other hand, that is to say twice as large as in the case in FIG. 1, it is merely necessary to select between $z/m=2^{27}/2^4=2^{23}$ cell groups in each chip; there is therefore a need for one address bit fewer than in the case in FIG. 1. The total number of selection bits to be delivered by the controller therefore does not need to be increased. It is merely necessary to reassign one of the 24 address bits used in the case in FIG. 1 for chip group selection within the rank. This may be done using one of the 10 column address bits used in the case in FIG. 1, so that the 25 selection bits from the controller are split as follows:

1 Rank selection bit,

1 Chip group selection bit
for selecting between the two chip groups within the rank, 2 Bank address bits
for selecting between $4=2^2$ banks within a RAM chip, 12 Row address bits
for selecting between $2^{12}$ row addresses within the bank, 9 Column address bits
for selecting between $2^9$ disjoint column groups of m=16 columns each for each row address.

The rank selection bit and the chip group selection bit are decoded in the control signal register SR shown in FIG. 2 such that a separate chip group activation signal is generated for each chip group. The activation signal for the first chip group is applied to the Chip Select inputs C of the relevant chips D[1,2,5,6] via a line DS1, and the selection signal for the second chip group is applied to the Chip Select inputs C of the relevant chips D[3,4,7,8] via a line DS2. In addition, the control signal register SR delivers the 23 address bits for selecting the cell group from m=16 respective memory cells within the RAM chips via the address bus AB.

The left-hand diagram in the bottom part of FIG. 2 shows the case in which a single 64-bit packet (burst length r=1) is read from a selected group of four RAM chips. What has been selected for the packet is the "close" chip group, which comprises the four chips D[1,2,5,6]. At time t0, the control signal register SR sends the start command for read-accessing four 16-bit data groups d1, d2, d5, d6 in the packet. After the loop delay τ1, the data groups d1 and d5 reach the data register DR, and after a further delay τ2, the data groups d2 and d6 reach the data register DR. The additional waiting time Tx between the arrival of the first data and the arrival of the last data in the 64-bit packet is thus just $$Tx=\tau 2$$

and is thus much shorter than in the known case shown in FIG. 1. No later than after a further time period τd has elapsed, the last data are also valid at the reception location at time tp, and the entire 64-bit packet can be forwarded in parallel form.

As can easily be seen, the waiting time upon selection of the "distant" chip group D[3,4,7,8] for a 64-bit single packet is $$Tx=\tau 4,$$

which is likewise much shorter than in the known case.

In the case of a burst of r successive 64-bit data packets, the same chip group is selected for all the packets in the same burst. The right-hand diagram in the bottom part of FIG. 2 shows the case in which a burst of length r=4 is read from the "close" chip group, which comprises the four chips D[1,2,5,6]. In burst mode, the bank, row and column address bits are sent only for the addresses of the data groups in the first packet of the burst; the address advance for the data groups in the subsequent packets of the burst is then effected automatically within the chips using an address counter, as is known per se. At time t0, the control signal register SR sends the start command for reading the burst. After the loop delay τ1, the data register DR receives the first two data groups D[1,5]-1 in the first packet at time t1, and after a further delay time τ2, the last two data groups d[2,6]-1 in the first packet arrive at time tp. The total time Tb from arrival of the first data in the burst to the end of the burst is then $$Tb=\tau 2+r^*\tau d.$$

If the "distant" chip group D[3,4,7,8] is selected for the read data burst, the total time Tb from arrival of the first data in the burst to the end of the burst is then $$Tb=\tau 4+r^*\tau d.$$

Figure 3:
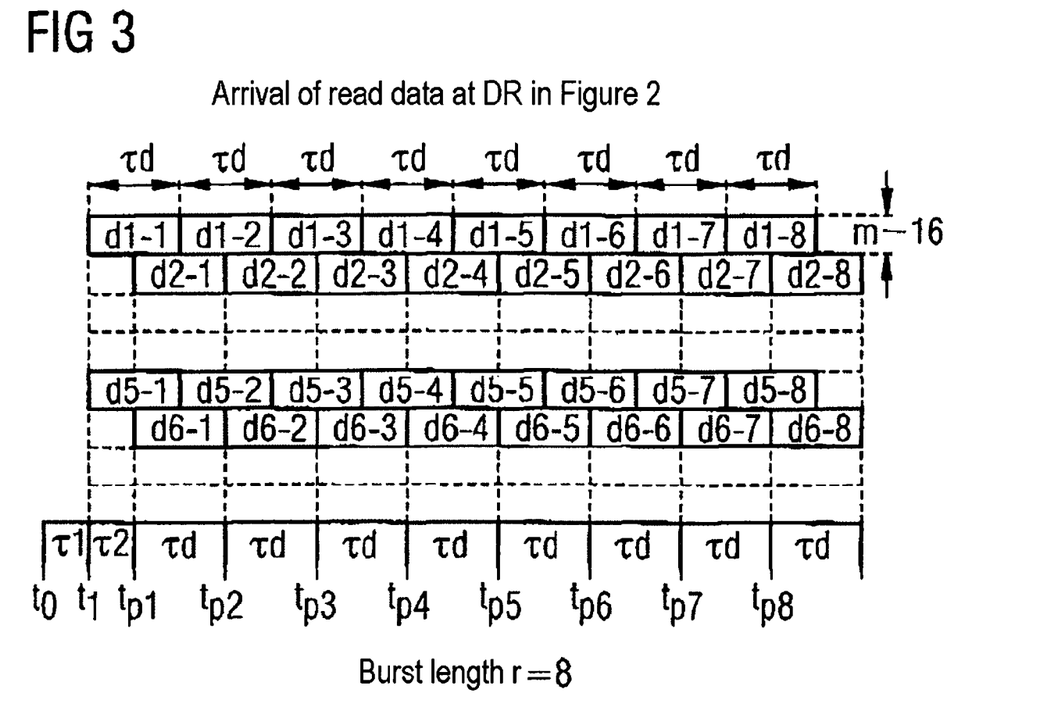
FIG. 3 shows, for the memory module shown in FIG. 2, the time-staggered arrival of read data at the data register with a burst length r=8.

As another example, FIG. 3 shows, for the memory module shown in FIG. 2, the time-staggered arrival of read data at the data register with a burst length r=8.

In general terms, the waiting time Tx between the arrival of the first and last data groups in a data packet in the case of the memory module shown in FIG. 2 is only as great as the difference in the loop delays between the chips within a chip group. In the memory module shown in FIG. 2, Tx is either equal to τ2 or is equal to τ4, depending on whether the close or distant chip group is being addressed. In practice, it can be assumed that the difference in the loop delay between two respective directly adjacent chips is always at least approximately the same. This means that τ2 and τ4 are also at least approximately the same.

However, it is even possible to make Tx zero by performing the group classification for the RAM chips such that each addressed group comprises RAM chips which have the same bus length. For the memory module shown in FIG. 2, this would be the chip groups D[1,5] and D[2,6] and D[3,7] and D[4,8], that is to say groups comprising just two respective chips. To this end, however, each of the chips involved would need to be designed for a bit width of m=n/2=32. This requires that a new generation of RAM chips be created, however, because the RAM chips currently produced industrially are designed for a bit width of no more than m=16.

With memory modules which contain the RAM chips currently available commercially with a bit width of m=16, a 64-bit mode with Tx=0 is possible if the physical arrangement of the chips is such that four respective chips have the same bus length. Such an arrangement is shown in FIG. 4.

The memory module shown in FIG. 4 contains k=16 RAM chips D[1:16] and a central transmission/reception block SE, on which the 64-bit data port DP for inputting and outputting the 64-bit data packets and the control signal port SP for inputting selection bits for selecting the chips and addressing the cell groups within the chips are located. The 16 RAM chips form two rows of eight chips each D[1:8] and D[9:16], which are arranged symmetrically with respect to the transmission/reception block SE. The two rows may either be arranged on the same surface of a board, or one row may be arranged on the front and the other on the back of the board. In addition, both halves of each row are situated symmetrically with respect to the transmission/reception block SE. Such physical arrangements of RAM chips for a memory module are known per se. In the prior art, the two chip rows are operated as two ranks, which are selectively addressed using the rank selection bit mentioned further above.

The chips D[1:16] of the memory module shown in FIG. 4 correspond in design to the RAM chips shown in FIG. 2. They are similarly designed for a data bit width of m=16 and are respectively connected to the central transmission/reception block SE via a 16-bit data bus DB. Each RAM chip has an address port for applying 23 address bits and a connection C for activating the relevant chip, as in the case in FIG. 2.

As a result of the memory module's double-symmetrical arrangement which has been described, four respective chips are at the same distance or bus length from the transmission/reception block SE. There are thus k/4=16/4=4 chip groups with the same respective value of loop delay for the read mode: the group D[1,5,9,13] with the loop delay τ1, the group D[2,6,10,14] with the loop delay τ1+τ2, the group D[3,7,11,15] with the loop delay τ1+τ2+τ3, and finally the group D[4,8,12,16] with the loop delay τ1+τ2+τ3+τ4. Accordingly, in line with the principle of the invention, four RAM chips belonging to the same group are always selected for the four 16-bit data groups of a 64-bit packet. Hence, as FIG. 4 shows, the data buses DB of all those respective chips which are not part of the same group can be interconnected. That is to say that the data buses on the chips D[1:4] are interconnected, and also the data buses on the chips D[5:8], the data buses on the chips D[9:12] and the data buses on the chips D[13:16].

Within the transmission/reception block SE, there is the data register DR, which transmits the data between the data buses DB and the data port DP, and the control signal register SR, which processes 25 selection bits from the control signal port SP. The control signal register SR organizes the 25 selection bits as follows:

2 Chip group selection bits
for selecting between the four chip groups of the module;
2 Bank address bits
for selecting between $4=2^2$ banks within a RAM chip;
12 Row address bits
for selecting between $2^{12}$ row addresses within the bank;
9 Column address bits
for selecting between $2^9$ disjoint column groups of m=16 columns each for each row address.

The two chip group selection bits are decoded in the control signal register of the transmission/reception block SE shown in FIG. 4 such that a separate chip group activation signal is generated for each of the four chip groups. The activation signal for the first chip group D[1,5,9,13] is applied to the Chip Select inputs C of the relevant chips via a line DS1; the activation signal for the second chip group D[2,6,10,14] is applied to the Chip Select inputs C of the relevant chips via a line DS2; the activation signal for the third chip group D[3,7,11,15] is applied to the Chip Select inputs C of the relevant chips via a line DS3; the activation signal for the fourth chip group D[4,8,12,16] is applied to the Chip Select inputs C of the relevant chips via a line DS4.

Figure 5:
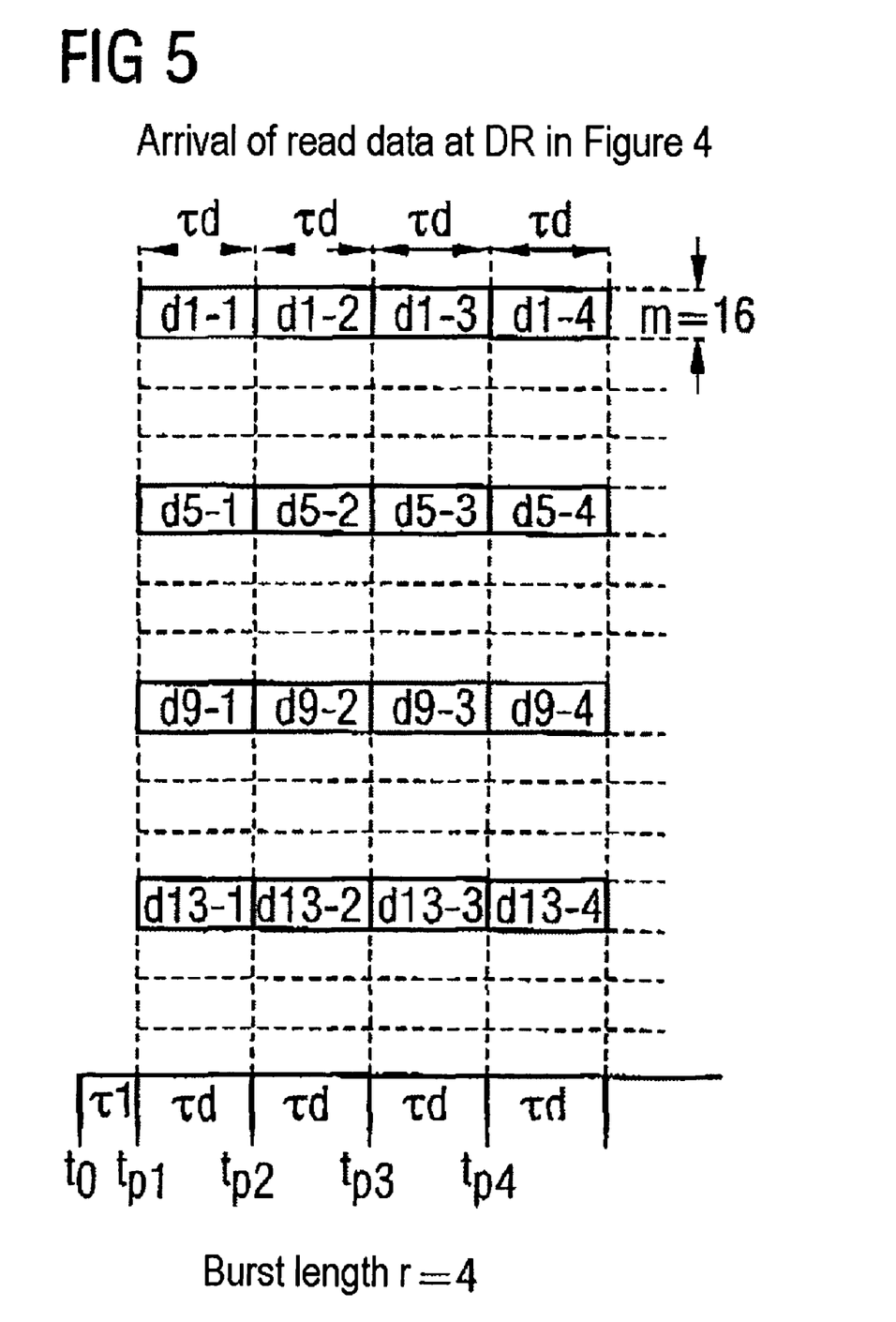
FIG. 5 shows, for the memory module shown in FIG. 4, the time-staggered arrival of read data at the data register with a burst length r=4.

On the memory module shown in FIG. 4, the same chip group is selected for all r 64-bit data packets in the same respective burst of length r. FIG. 5 shows an example of the reading of a burst of length r=4, with the "close" chip group D[1,5,9,13] being selected for all four data packets in this burst. At time t0, the control signal register SR sends the start command for reading the burst. Since the loop delays via the four chips D[1,5,9,13] are all of the same length, in the example shown all equal to τ1, all four data groups d[1,5,9,13]-1 arrive at the data register DR simultaneously at time t1=t0+τ1. An additional waiting time Tx is thus dispensed with fully. The total time Tb from the arrival of the first data to the end of the burst at the reception location is Tb=r*τd, and it is also independent of which of the four chip groups is selected for the burst.

Since, in the case of a memory module organized in line with embodiments of the invention, all m-bit data groups of the same data packet and, in the case of a burst containing r successive packets, also all r packets of the same burst are respectively assigned the same chip group of the module, specifically both for reading and for writing, each write or read cycle is limited to one chip group. From cycle to cycle, it is naturally also possible to access different chip groups in order to use the total storage capacity of the module.

It should also be mentioned that punctual clocking of all operations during operation of the memory modules described is achieved through appropriate design of a time control device which is connected to the control signal register SR, to the data register DR and also to the RAM chips via clock lines. This time control device and also the clock lines are not shown in FIGS. 2 and 4, so as not to make the drawings complicated.

The memory module embodiments and modes of operation described above with reference to FIGS. 2 to 5 are merely exemplary embodiments of the invention; numerous other variants within the framework of the principle of the invention are naturally possible. Thus, the transmission/reception block may also be arranged outside of the RAM board directly on the memory controller (not shown) and may be connected to the block of the RAM chips via a 64-bit bus, which does not branch until close to the RAM chips. In this case, the loop delay times are naturally longer, which changes nothing about the differences in the loop delay times, however.

Instead of decoding the selection bits in the control signal register SR, the selection bits can also be decoded on the individual RAM chips, which in this case would respectively need to be provided with an additional or correspondingly modified address decoding device.

It is contemplated that the number k of RAM chips and/or the number z of memory cells per chip and/or the number m of bits per data group and/or the number n of bits per data packet and/or the number q of chip groups differ from those in the examples described. The number k of RAM chips may be an even number which is at least equal to 4. Preferably (but not necessarily), all the numbers cited above are integer powers of 2 to simplify addressing. Thus, an arrangement with k=16 chips, as shown in FIG. 4, can also be classified into q=2 chip groups with k/q=8 chips each: a first group D[1,2,5,6,9,10,13,14] and a second group D[3,4,7,8,11,12,15,16]. In this case, the bit width for each chip would be m=8, as in the prior art, but in this case, unlike in the prior art, the total module would need to be operated as one rank with the inventive group classification, and the data buses on the chip pairs D[1,3], D[2,4], D[5,7], D[6,8], D[9,11], D[10,12], D[13,15] are respectively interconnected.

While the foregoing is directed to embodiments of the present invention, other and further embodiments of the invention may be devised without departing from the basic scope thereof, and the scope thereof is determined by the claims that follow.

What is claimed is:

1. An memory arrangement, comprising:
an even number k≧4 of physically spaced RAM chips, each RAM chip having a plurality z of memory cells which are organized in disjoint cell groups, wherein, in each cell group, m respective memory cells can respectively be selected simultaneously by a cell group address in order for m data items to be respectively written or read simultaneously via an m-bit data bus on the respective RAM chip and collectively as an n-bit data group;
a register, connected between the respective m-bit data bus of each RAM chip and an n-bit parallel port, for buffering and transmitting n respective parallel data bits as an n-bit packet between the n-bit parallel port and the m-bit data buses, wherein n is equal to an integer multiple of m and wherein a number of m-bit data groups which corresponds to the integer multiple is written or read in parallel via the m-bit data buses; and a selection device which responds to selection bits in order to select a respective separate cell group within the number of chips which corresponds to the integer multiple for each of the disjoint m-bit groups of the n-bit packet in order to write or read the number of m-bit data groups which corresponds to the integer multiple in parallel via respectively associated m-bit data buses;

wherein the k RAM chips are classified into $q \geq 2$ disjoint chip groups, each group comprising k/q chips which are disposed at substantially same distances from the register, wherein $m = q \ast n/k$, wherein the selection device is configured to select one chip group from the $q \geq 2$ disjoint chip groups for each n-bit packet, and wherein a respective m-bit data group is written to or read from the register in parallel from each chip of the selected chip group via the associated m-bit data bus.

2. The memory arrangement of claim 1, wherein the selection device is configured to transmit a burst of r successive n-bit packets by selecting the same chip group for all r packets in the burst.

3. The memory arrangement of claim 1, wherein the selection device is configured to transmit a burst of r successive n-bit packets by selecting different chip groups for different packets in the burst.

4. The memory arrangement of claim 3, wherein the respective m-bit data buses of each disjoint chip group are connected to the same respective connections of the register to buffer and transmit n respective parallel data bits.

5. The memory arrangement of claim 2, wherein the respective m-bit data buses of each disjoint chip group are connected to the same respective connections of the register to buffer and transmit n respective parallel data bits.

6. The memory arrangement of claim 1, wherein the respective m-bit data buses of each disjoint chip group are connected to the same respective connections of the register to buffer and transmit n respective parallel data bits.

7. A memory apparatus, comprising:

a plurality of memory chips grouped into at least two groups equal in number of chips, each group having at least one pair of memory chips, each memory chip having a chip select input;

a data register for transferring data to and from the plurality of memory chips;

a plurality of data buses respectively connected between the plurality of memory chips and the data register, wherein at least one pair of memory chips in each group are respectively connected to exhibit substantially same loop delays; and a selection device connected to the respective chip select input of each memory chip, wherein the selection device provides an activation signal to selectively activate each group of memory chips for data transfer, wherein the selection device is configured to transmit a burst of a plurality of successive data packets by selecting the same group of memory chips for all data packets in the burst.

8. The memory apparatus of claim 7, further comprising:

an address bus connected between the control signal register and the plurality of memory chips.

9. A memory apparatus, comprising:

a plurality of memory chips grouped into at least two groups equal in number of chips, each group having at least one pair of memory chips, each memory chip having a chip select input;

a data register for transferring data to and from the plurality of memory chips;

a plurality of data buses respectively connected between the plurality of memory chips and the data register, wherein at least one pair of memory chips in each group are respectively connected to exhibit substantially same loop delays; and a selection device connected to the respective chip select input of each memory chip, wherein the selection device provides an activation signal to selectively activate each group of memory chips for data transfer, wherein the selection device is configured to transmit a burst of a plurality of successive data packets by selecting different groups of memory chips for at least two data packets in the burst.

10. A memory apparatus, comprising:

a plurality of memory chips grouped into at least two groups equal in number of chips, each group having at least one pair of memory chips, each memory chip having a chip select input;

a data register for transferring data to and from the plurality of memory chips;

a plurality of data buses respectively connected between the plurality of memory chips and the data register, wherein at least one pair of memory chips in each group are respectively connected to exhibit substantially same loop delays; and a selection device connected to the respective chip select input of each memory chip, wherein the selection device provides an activation signal to selectively activate each group of memory chips for data transfer, wherein each data bus has a bit width which is equal to a bit width of the data register divided by a number of memory chips which are selectively activated at one time.

11. The memory apparatus of claim 10, wherein each data bus connected to the memory chips of the same group are configured to transfer one or more data packets in parallel.

12. A memory apparatus, comprising:

a plurality of memory chips grouped into at least two groups equal in number of chips, each group having at least one pair of memory chips, each memory chip having a chip select input;

a data register for transferring data to and from the plurality of memory chips;

a plurality of data buses respectively connected between the plurality of memory chips and the data register, wherein at least one pair of memory chips in each group are respectively connected to exhibit substantially same loop delays; and a selection device connected to the respective chip select input of each memory chip, wherein the selection device provides an activation signal to selectively activate each group of memory chips for data transfer, wherein the plurality of memory chips are grouped into a first group and a second group, wherein the first group comprises a first pair of memory chips each connected to exhibit a first loop delay, wherein the second group comprises a second pair of memory chips each connected to exhibit a second loop delay, and wherein the first loop delay is shorter than the second loop delay.

13. The memory apparatus of claim 12, wherein the first group further comprises a third pair of memory chips each connected to exhibit a third loop delay, wherein the second group further comprises a fourth pair of memory chips each connected to exhibit a fourth loop delay, wherein the second loop delay is shorter than the third loop delay, and wherein the third loop delay is shorter than the fourth loop delay.

14. The memory apparatus of claim 13, wherein the first pair of memory chips and the second pair of memory chips are activated at one time by the activation signal while the third pair of memory chips and the fourth pair of memory chips are inactivated by the activation signal, and wherein the third pair of memory chips and the fourth pair of memory chips are activated at one time by the activation signal while the first pair of memory chips and the second pair of memory chips are inactivated by the activation signal.

15. A memory apparatus, comprising:
a plurality of memory chips grouped into at least two groups equal in number of chips, each group having four memory chips, each memory chip having a chip select input;
a data register for transferring data to and from the plurality of memory chips;
a plurality of data buses respectively connected between the plurality of memory chips and the data register, wherein the four memory chips in each group are respectively connected to exhibit substantially same loop delays; and
a selection device connected to the respective chip select input of each memory chip, wherein the selection device provides an activation signal to selectively activate one group of memory chips for data transfer and inactivate the other groups of memory chips, and wherein each data bus has a bit width which is equal to a bit width of the data register divided by a number of memory chips which are selectively activated at one time, wherein the selection device is configured to transmit a burst of a plurality of successive data packets by selecting the same group of memory chips for all data packets in the burst.

16. The memory apparatus of claim 15, wherein the plurality of memory chips are grouped into four groups and are disposed in a double-symmetrical dual inline memory module.

17. A memory apparatus, comprising:
a plurality of memory chips grouped into at least two groups equal in number of chips, each group having four memory chips, each memory chip having a chip select input;
a data register for transferring data to and from the plurality of memory chips;
a plurality of data buses respectively connected between the plurality of memory chips and the data register, wherein the four memory chips in each group are respectively connected to exhibit substantially same loop delays; and
a selection device connected to the respective chip select input of each memory chip, wherein the selection device provides an activation signal to selectively activate one group of memory chips for data transfer and inactivate the other groups of memory chips, and wherein each data bus has a bit width which is equal to a bit width of the data register divided by a number of memory chips which are selectively activated at one time, wherein the selection device is configured to transmit a burst of a plurality of successive data packets by selecting different groups of memory chips for at least two data packets in the burst.

18. The memory apparatus of claim 8, wherein the plurality of memory chips are arranged in a dual inline memory module, and wherein each memory chip comprises a plurality of memory banks.

* * * * *